(12) United States Patent
Jackson et al.

(10) Patent No.: US 10,921,202 B2
(45) Date of Patent: Feb. 16, 2021

(54) TAMPER DETECTION FOR BREAKABLE REMAKEABLE CONNECTIONS

(71) Applicant: Palo Alto Research Center Incorporated, Palo Alto, CA (US)

(72) Inventors: Warren B. Jackson, San Francisco, CA (US); Eugene M. Chow, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 223 days.

(21) Appl. No.: 16/205,042

(22) Filed: Nov. 29, 2018

(65) Prior Publication Data

US 2020/0173876 A1    Jun. 4, 2020

(51) Int. Cl.
| | |
|---|---|
| G01R 31/68 | (2020.01) |
| H05K 1/02 | (2006.01) |
| G01L 5/167 | (2020.01) |
| G01B 5/30 | (2006.01) |
| G01B 7/16 | (2006.01) |
| G01B 11/16 | (2006.01) |
| G01R 31/50 | (2020.01) |

(52) U.S. Cl.
CPC ............. *G01L 5/167* (2013.01); *G01B 5/30* (2013.01); *G01B 7/16* (2013.01); *G01B 11/16* (2013.01); *G01R 31/50* (2020.01)

(58) Field of Classification Search
CPC .......... G01L 5/167; G01B 5/30; G01B 11/16; G01B 7/16; G01R 31/025; G01R 31/50; H05K 1/0275; H05K 1/117; H05K 2201/10121; H05K 2201/10151; H05K 2201/10106; H04L 63/1425; H04L 41/0677; H04L 63/1433; H04L 43/16; H04L 41/0213; H04L 63/1408; H04L 43/0864; H04L 63/1416; G11C 11/1695; G11C 14/0081; G11C 11/1693; G11C 7/20; G11C 11/1675
See application file for complete search history.

(56) References Cited

U.S. PATENT DOCUMENTS

| | | | |
|---|---|---|---|
| 9,455,233 B1* | 9/2016 | Bhooshan | H01L 23/576 |
| 10,127,409 B1* | 11/2018 | Wade | G06F 21/75 |
| 2015/0097572 A1* | 4/2015 | Wade | G06K 7/10257 324/537 |
| 2015/0137380 A1 | 5/2015 | in't Zandt et al. | |
| 2016/0188296 A1 | 6/2016 | Plusquellic | |
| 2017/0365316 A1 | 12/2017 | Wang et al. | |

\* cited by examiner

*Primary Examiner* — Brandi N Hopkins
(74) *Attorney, Agent, or Firm* — Mueting Raasch Group

(57) ABSTRACT

A tamper detection system includes a detector that measures a value of a parameter for each connection of multiple breakable remakeable connections between first and second components. The system includes an analyzer that compares the measured parameter value for each connection or a representative value derived from measured parameter values of the connections to an expected value. Based on the comparisons, the analyzer determines whether the multiple breakable remakeable connections between the first and second components have been broken and remade.

20 Claims, 14 Drawing Sheets

TAMPER DETECTION FOR BREAKABLE REMAKEABLE CONNECTIONS

BACKGROUND

Many electronic, optical, and/or optoelectronic systems depend on connections that route signals between different components of the system. In a typical application, multiple connections route multiple signals between a first component and a second component. For flexibility, the connections may allow one or both of the components to be removed from the circuit. The multiple connections between the first and second components are broken and remade when a component is removed and replaced or when an old component is removed and a new component is inserted in place of the old component.

BRIEF SUMMARY

Some embodiments involve a tamper detection system including a detector that measures a value of a parameter for each connection of multiple breakable remakeable connections between first and second components. The system comprises an analyzer that compares the measured parameter value for each connection or a representative value that characterizes the measured parameter values of the multiple connections to an expected value. The analyzer determines whether the multiple breakable remakeable connections between the first and second components have been broken and remade based on the comparisons.

According to some embodiments, a tamper detection system comprises a detector configured to measure a value of a parameter for each connection of multiple breakable remakeable connections between first and second components. The system comprises an analyzer that calculates one or more statistical values that characterize the distribution of measured parameter values. The analyzer compares the one or more statistical values respectively to one or more expected values and determines whether the multiple breakable remakeable connections between the first and second components have been broken and remade based on the comparisons.

Some embodiments are directed to a method of detecting that connections between first and second components have been broken and remade. A value of at least one parameter for each connection of multiple breakable remakeable connections between first and second components is measured. The measured values of the multiple breakable remakeable connections or one or more representative values that characterize the measured values are compared to at least one expected value. A determination is made as to whether the multiple breakable remakeable connections between the first and second components have been broken and remade based on the comparison.

BRIEF DESCRIPTION OF DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION OF ILLUSTRATIVE EMBODIMENTS

It is desirable to have breakable and remakeable connections in electronic or optical systems, for example, breakable and remakeable connections communications connections between modules in electronic, optical and/or optoelectronic systems. Breakable and remakeable connections facilitate modular design, fabrication, deployment, and field service. However, an inability to detect changes in breakable remakeable connections represents a security vulnerability. Embodiments disclosed herein are directed to a device that provides sensitivity to electrical, optical, mechanical and/or other changes in breakable remakeable connections that indicate that the connections have been broken and remade.

These changes may be detected and recorded locally and/or remotely and used to determine whether or not the connections have been broken and remade. The ability to detect small changes in the breakable remakeable connections provides a way to determine if components have been removed and replaced, thereby impeding "man in the middle (MITM)" and/or other types of cybersecurity attacks.

Figure 1:
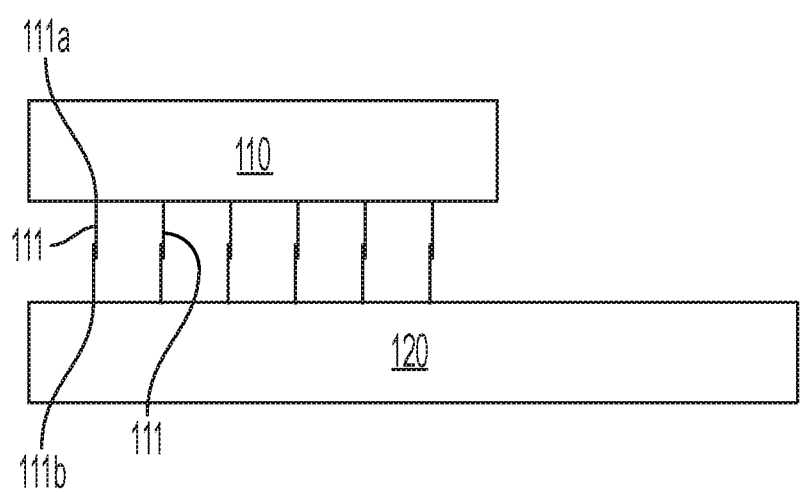
FIG. 1 is a simplified block diagram illustrating first and second components that are electrically, optically, or optoelectronically connected by breakable remakeable connections which can be monitored for tamper detection in accordance with embodiments disclosed herein.

FIG. 1 is a simplified block diagram illustrating first 110 and second components 120 that are electrically, optically, or optoelectronically connected by breakable remakeable connections 111. Each connection includes a first side 111a proximate the first component 110 and a second side 111b proximate the second component 120. The breakable remakeable connections 111 allow the first component 110 to be mechanically disconnected from the second component 120 thereby terminating the electrical, optical, magnetic, sonic or optoelectronic communication path between the first component 110 and the second 120 component. The same first component 110 or a different component can subsequently be reconnected to the second component 120 via the breakable remakeable connections 111. Embodiments disclosed herein are directed to systems and methods for detecting that the multiple connections 111a have been broken and remade.

Figure 2:
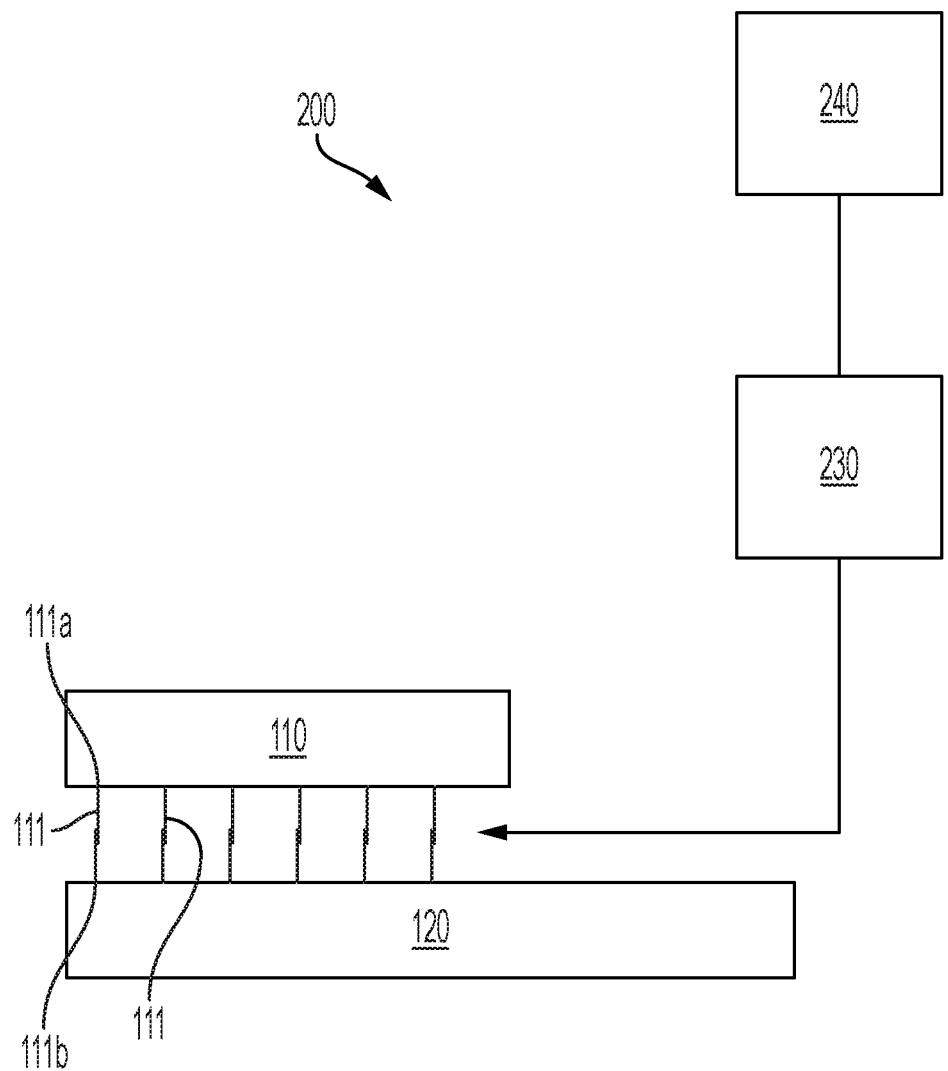
FIG. 2 is a diagram illustrating a system that determines whether breakable remakeable connections have been mechanically broken and remade in accordance with some embodiments.

FIG. 2 is a diagram illustrating a system 200 that determines whether breakable remakeable connections have been mechanically broken and remade. The system 200 includes a detector 230 configured to measure a value of at least one parameter for each connection 111 of multiple breakable remakeable connections between first and second components 110, 120. An analyzer 240 is communicatively coupled to the detector 230 and determines whether the multiple breakable remakeable connections 111 between the first and second components 110, 120 have been broken and remade based on the measured values.

According to some aspects, the at least one parameter may be an electrical parameter, such as voltage, current, impedance, resistance, capacitance, inductance, etc. According to some aspects, the parameter may be an optical parameter such as optical transmissivity, optical reflectivity, rotation of polarization, etc. According to yet other aspects, the parameter may be a mechanical parameter, such as stress, strain, bending force, etc. According to some embodiments, the at least one parameter may be a waveform parameter such as rise time more fall time. According to some embodiments, the value of the parameter may be measured based on transmission of a signal through the connection or reflectance of a signal from a connection boundary. According to some embodiments, the value of the parameter is measured using a sensor disposed on or proximate to the connection.

Figure 3:
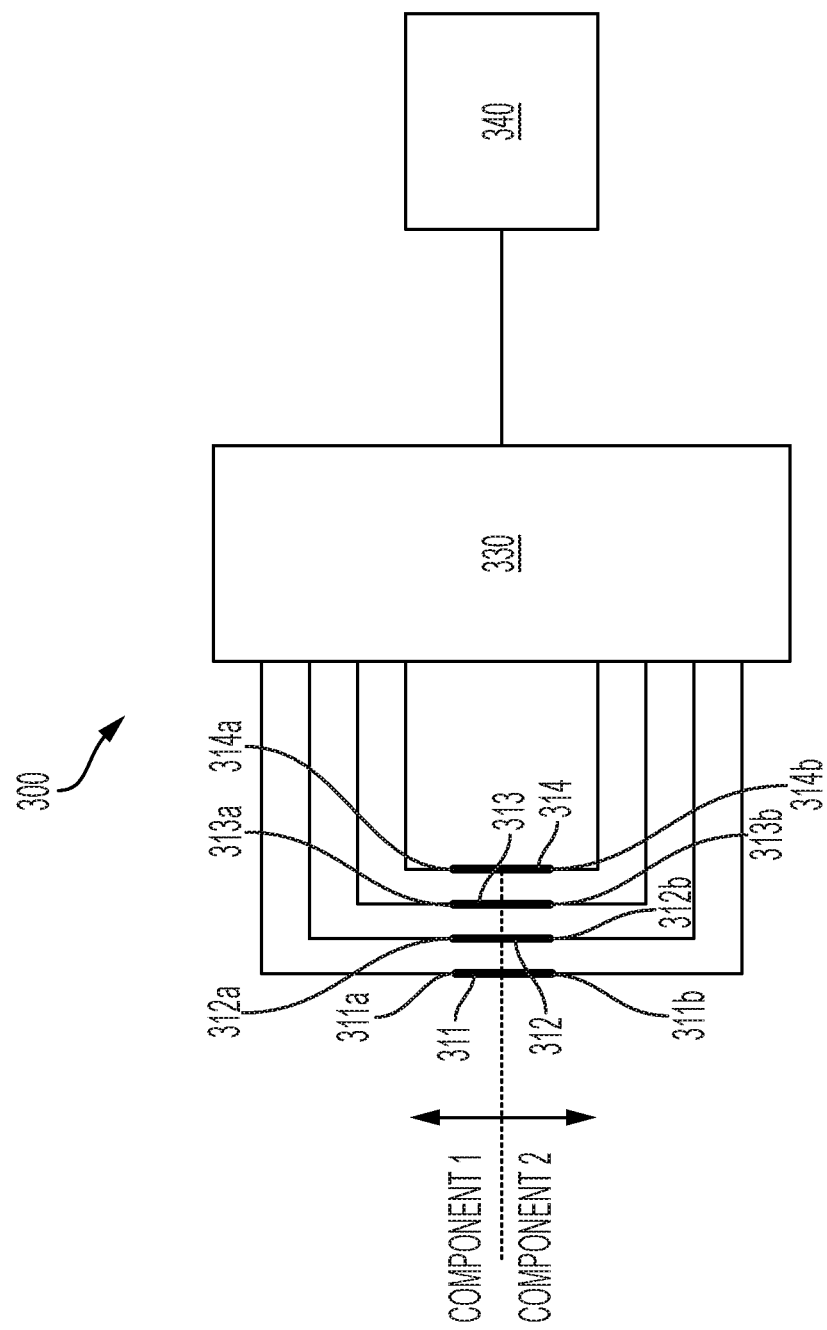
FIG. 3 illustrates a system configured to measure a value of at least one transmission parameter for each connection of multiple breakable remakeable connections between first and second components in accordance with some embodiments.

FIG. 3 illustrates a system 300 configured to measure a value of at least one transmission parameter for each connection of multiple breakable remakeable connections 311, 312, 313, 314 between first and second components. FIG. 3 shows four connections 311, 312, 313, 314, however, in a typical configuration the number of connections may be greater than four. Each connection 311, 312, 313, 314 has a first side 311a, 312a, 313a, 314a proximate the first component and a second side 311b, 312b, 313b, 314b proximate the second component. In this embodiment, the detector 330 is connected to both sides 311a, 311b, 312a, 312b, 313a, 313b, 314a, 314b of each connection 311, 312, 313, 314. In this arrangement, the detector 330 may apply signals at one side 311a, 311b, 312a, 312b, 313a, 313b, 314a, 314b of each of the connections 311, 312, 313, 314 and measure the transmitted signals responsive to the applied signals at each of the other sides 311b, 311a, 312b, 312a, 313b, 313a, 314b, 314a of the connections 311, 312, 313, 314. The analyzer 340 uses the measured values of the signals transmitted through the connections (or values representative of the values of the transmitted signals as discussed in more detail below) to assess whether the multiple connections 311, 312, 313, 314 have been broken and remade.

Figure 4:
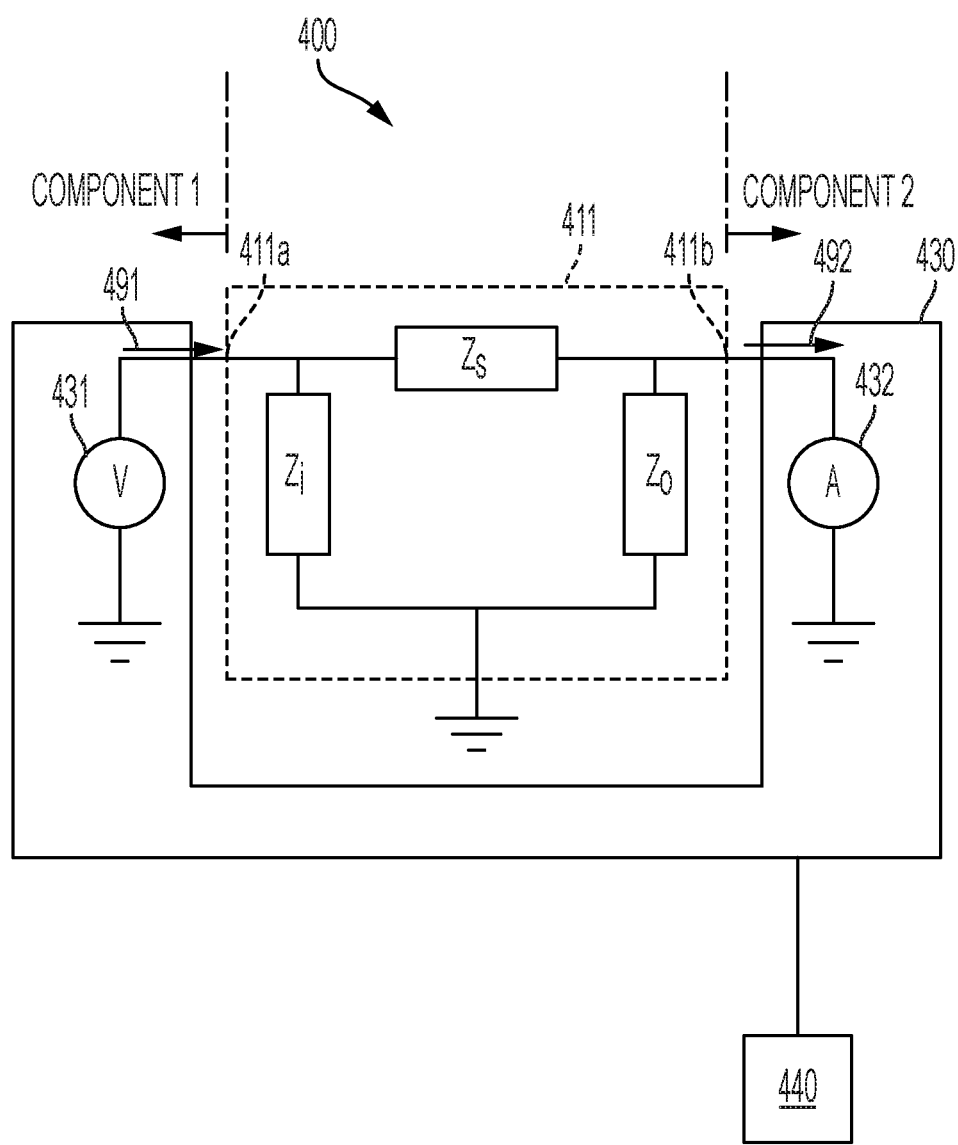
FIG. 4 is a block diagram of a system configured to measure a value of a transmission parameter for each connection of multiple electrical breakable remakeable connections between first and second components in accordance with some embodiments.

FIG. 4 is a block diagram of a system 400 for detecting whether multiple electrical breakable remakeable connections have been broken and remade. The block diagram provides an equivalent circuit of an electrical breakable remakeable connection 411 that electrically connects a first component and a second component. The electrical breakable remakeable connection 411 may comprise a pin and socket type connection, an edge connection, an inline cable connection, a microspring connection, or other type of connection for example. The equivalent circuit 411 comprises an input impedance output impedance $Z_o$, and series connection impedance $Z_s$. If the connection 411 is broken and remade, the value of the connection impedance $Z_s$ changes from an initial value $Z_{s0}$ to $Z_{s1} \neq Z_{s0}$.

FIG. 4 shows a detector 430 that includes an electrical signal generator 431 configured to generate a signal 491 that is applied at one end 411a of the connection 411. The detector 430 includes an electrical signal detector 432 configured to measure a value of one or more parameters of the electrical signal 492 that is received at the second end 411b of the connection 411.

An analyzer 440 is coupled to the detector 430 and determines whether the multiple breakable remakeable connections 411 between the first and second components have been broken and remade based on measured parameter values of the transmitted signal 492. The parameters useful for determining if a connection has been broken and remade may comprise, for example, impedance magnitude, impedance phase, resistance value, reactance value. In some embodiments the detector 430 is configured to capture the waveform of the transmitted signal 492 and the measured values are values of waveform parameters. For example, waveform parameters useful for determining if a connection has been broken and remade may be a rise time or fall time of the transmitted signal waveform 492.

Figure 5:
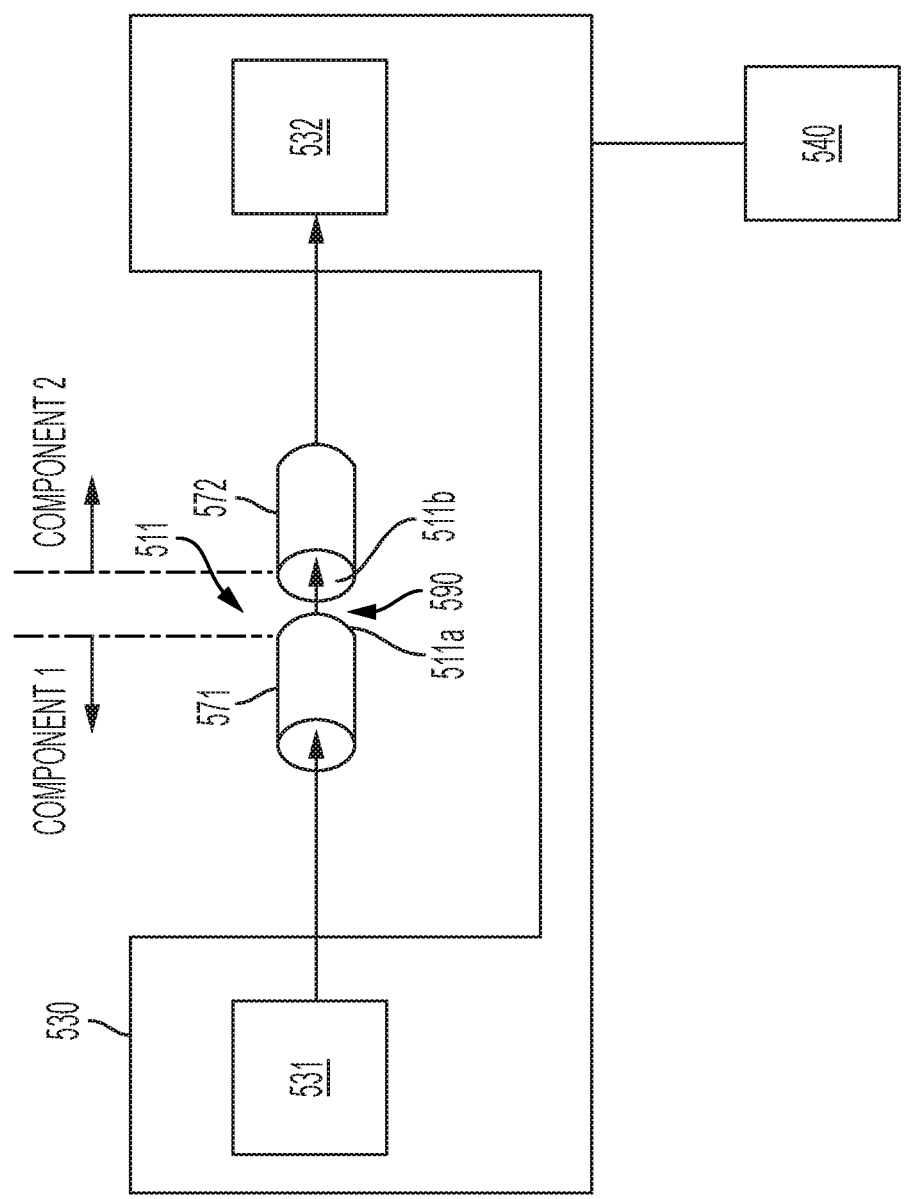
FIG. 5 is a block diagram of a system configured to measure a value of a transmission parameter for each connection of multiple optical breakable remakeable connections between first and second components in accordance with some embodiments.

FIG. 5 is a block diagram illustrating a breakable remakeable optical connection 511 that optically connects a first component 571 and a second component 572. In a typical application, the components 571, 572, would be optically connected through many optical connections such as connection 511.

Under normal operation, light exits the first optical component 571 through the first end 511a of the optical connection 511 and enters the second optical component 572 through the second end 511b of the optical connection 511. Disturbance of the connection 511 occurs when the optical connection 511 is broken and remade. Breaking and remaking the optical connection 511 can lead to changes in the connection 511 which in turn are indicated in an optical signal transmitted through the connection 511. For example, breaking and remaking the optical connection 511 can lead to changes in the values of parameters of the transmitted signal such as intensity of the transmitted signal, polarization direction of the optical signal, for example.

Detector 530 includes an optical source 531 optically coupled to the first side 511a of the optical connection 511 and an optical detector 532 optically coupled to the second side 511b of the optical connection 511. The optical source 531 is configured to generate an optical signal 591 which enters the optical connection 511 at the first side 511a. The optical detector 532 can measures parameter values of the optical signal 592 received at the second end 511*b*.

Analyzer 540 is coupled to the detector 530 and determines whether the multiple breakable remakeable optical connections 511 between the first and second optical components 571, 572 have been broken and remade based on values of the optical parameters of the transmitted signal 592, e.g., parameters such as optical signal intensity and/or polarization direction.

Figure 6:
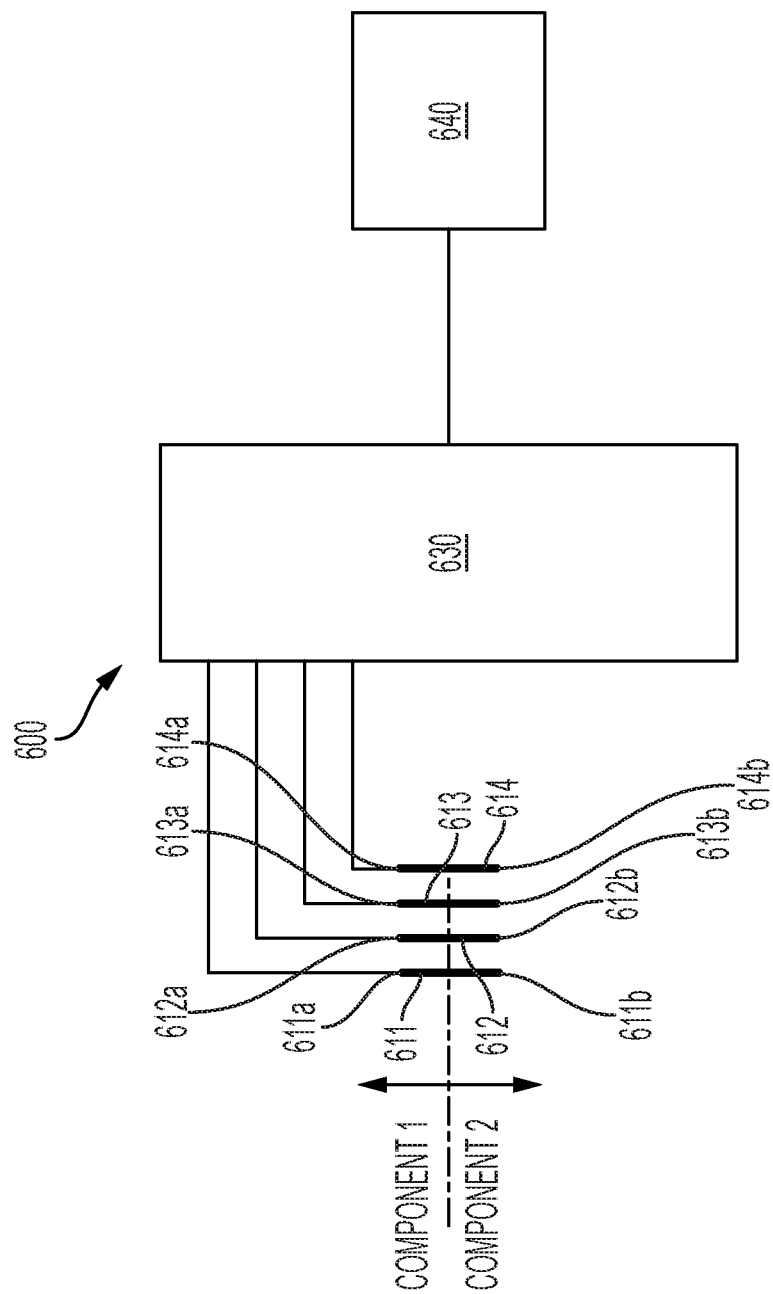
FIG. 6 illustrates a system configured to measure a value of at least one reflection parameter for each connection of multiple breakable remakeable connections between first and second components in accordance with some embodiments.

FIG. 6 illustrates a system 600 configured to measure a value of at least one reflection parameter for each connection of multiple breakable remakeable connections 611, 612, 613, 614 between first and second components. FIG. 6 shows four connections 611, 612, 613, 614, however, in a typical configuration the number of connections may be greater than four. Each connection 611, 612, 613, 614 has a first side 611*a*, 612*a*, 613*a*, 614*a* proximate the first component and a second side 611*b*, 612*b*, 613*b*, 614*b* proximate the second component. In this embodiment, the detector 630 is connected to first sides 611*a*, 612*a*, 613*a*, 614*a* of each connection 611, 612, 613, 614 and is not directly connected to second sides 611*b*, 612*b*, 613*b*, 614*b* of each connection 611, 612, 613, 614. In this arrangement, the detector 630 may apply signals at first sides 611*a*, 612*a*, 613*a*, 614*a* of each of the connections 611, 612, 613, 614 and measure the reflected signals responsive to the applied signals at the first sides 611*a*, 612*a*, 613*a*, 614*a* of each of the connections 611, 612, 613, 614. Although FIG. 6 shows the detector 630 coupled to the first sides 611*a*, 612*a*, 613*a*, 614*a* of connections 611, 612, 613, 614 it is alternatively possible for the detector to be coupled to the second sides of the connections and not directly connected to the first sides. The analyzer 640 uses the measured values of the reflected signals to assess whether the multiple connections 611, 612, 613, 614 have been broken and remade.

Figure 7:
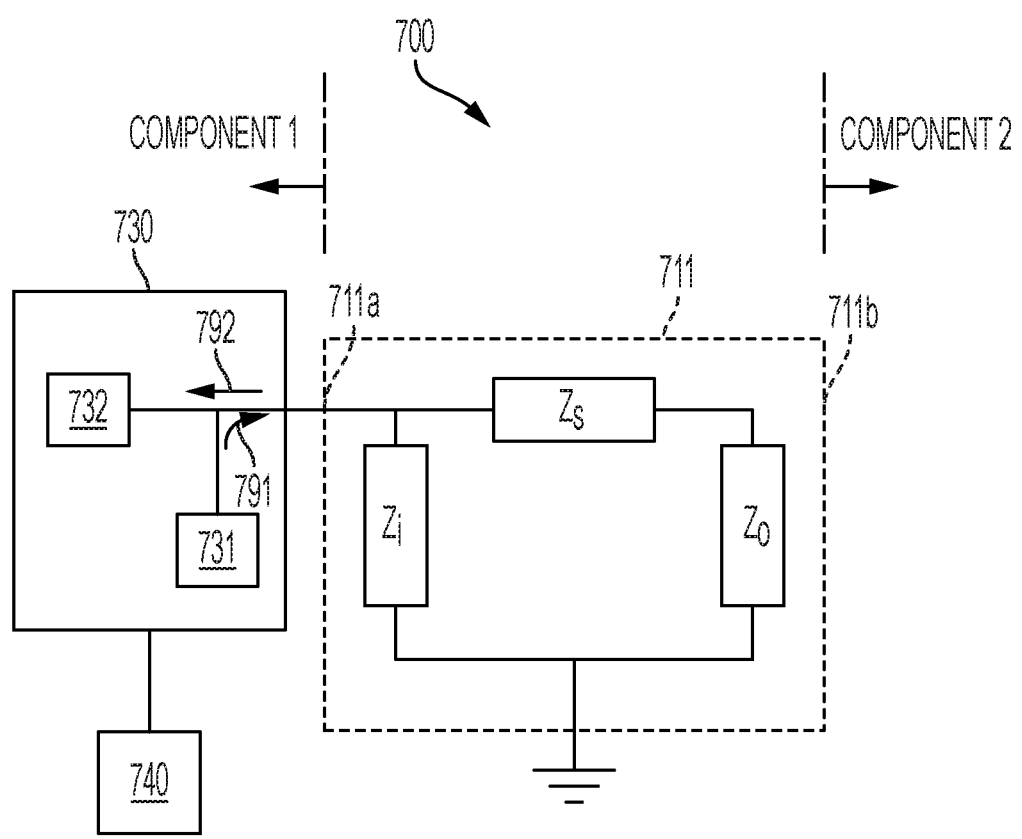
FIG. 7 is a block diagram of a system configured to measure a value of a reflection parameter for each connection of multiple electrical breakable remakeable connections between first and second components in accordance with some embodiments.

FIG. 7 is a block diagram of a system 700 configured to measure a reflection parameter, wherein the block diagram includes an equivalent circuit of an electrical breakable remakeable connection 711 that electrically connects a first component and a second component. As previously discussed, the electrical breakable remakeable connection 711 may comprise a pin and socket type connection, an edge connection, an inline cable connection, a microspring connection, or other type of connection for example. The equivalent circuit 711 comprises an input impedance $Z_i$, output impedance $Z_o$, and series connection impedance $Z_s$. If the connection 711 is broken and remade, the value of the connection impedance $Z_s$ changes from an initial value $Z_{s0}$ to $Z_{s1} \neq Z_{s0}$.

FIG. 7 shows a detector 730 that includes a signal generator 731 configured to generate a signal 791, e.g., a pulse, which is applied to the first end 711*a* of the connection 711. The detector includes a detector 732 configure to measure values of one or more parameters of a reflected signal 792 responsive to the applied signal 791. Before connection 711 is broken and remade, the connection impedance is $Z_{s0}$. After the signal is broken and remade, the connection impedance changes to $Z_{s1} \neq Z_{s0}$. The change in the connection impedance changes the values of one or more parameters of the reflected signal 732. The detector 732 measures the parameter values of the reflected signal 792.

Analyzer 740 is coupled to the detector 730 and determines whether the multiple breakable remakeable connections 711 between the first and second components have been broken and remade based on the measured parameter values of the reflected signal 792. In some embodiments, parameters useful for determining if a connection has been broken and remade may comprise, for example, impedance magnitude, impedance phase, resistance value, reactance value. In some embodiments, the electrical signal detector 732 captures a waveform of the reflected signal 792 and the measured parameter values are values of a waveform parameter such as rise time or fall time of the waveform of reflected signal 792. The analyzer 740 determines if the connection 711 has been broken and remade based on the waveform parameter values.

Figure 8:
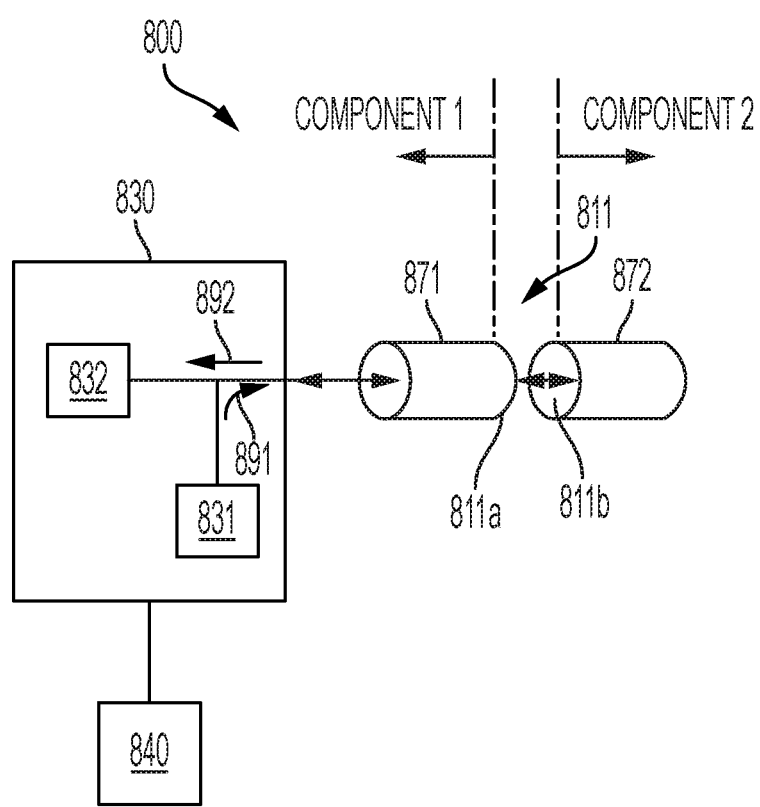
FIG. 8 is a block diagram of a system configured to measure a value of a reflection parameter for each connection of multiple optical breakable remakeable connections between first and second components in accordance with some embodiments.

FIG. 8 is a block diagram illustrating a breakable remakeable optical connection 811 that optically couples a first component 871 and a second component 872. In a typical application, the components 871, 872, would be optically coupled through multiple optical connections such as connection 811.

During normal operation, light signals from the first component 871 enter the first end 811*a* of the optical connection 811 and exit through the second end 811*b* of the optical connection 811 to reach the second component 872. Light signals from the second component 872 may enter the second end 811*b* of the optical connection 811 and exit through the first end 811*a* of the optical connection to reach the first component 871. Disturbance of the connection 811 occurs when the optical connection 811 is broken and remade. Breaking and remaking the optical connection 811 can lead to changes of the optical connection 811 that can be detected by analyzing parameter values of a reflected optical signal 892. For example, parameter values of the reflected signal 892 that may change when the connection 811 is broken and remade can include intensity of the reflected signal 892, polarization direction of the reflected signal 892, and or other parameter values of the reflected signal 892.

Detector 830 includes an optical source 831 and an optical detector 832 optically coupled to a first side 811*a* of the optical connection 811. The optical source 831 is configured to generate an optical signal 891 which is coupled in to the first end 811*a* of the optical connection 811. The optical signal 891 is reflected at the optical connector 811 and/or at the second component and the reflected signal 892 is detected by the optical detector 832. The optical detector 832 is configured to measure values of one or more parameters of the reflected optical signal 892.

in some embodiments, the reflection could go into 872 and back rather than just at the connection 811*a*. In this case, the signal is proportional to the transmitted signal times the second component reflection fraction. The optical detector 832 is configured to measure values of one or more parameters of the reflected optical signal 892.

The analyzer 840 is coupled to the detector 830 and determines whether the multiple breakable remakeable connections 811 between the first and second optical components 871, 872 have been broken and remade based on measured parameter values of the reflected signal 892, e.g., parameters such as intensity of the reflected signal 892 and/or polarization direction of the reflected optical signal 892.

According to some embodiments, the detector may comprise sensors disposed on or proximate to the connections. The sensors are arranged to sense one or more parameters of the connection. Such sensors may be particularly useful to measure values of mechanical parameters of electrical connections, such as deformation or strain, and/or other mechanical parameters. For example, in some embodiments, the sensors may comprise piezoelectric material coupled to the connections as discussed in further detail with reference to FIG. 10. In some embodiments, the sensors may comprise strain gauges or optical fiber Bragg grating (FBG) sensors mechanically coupled to the connections as discussed in further detail with reference to FIG. 11.

Figure 9:
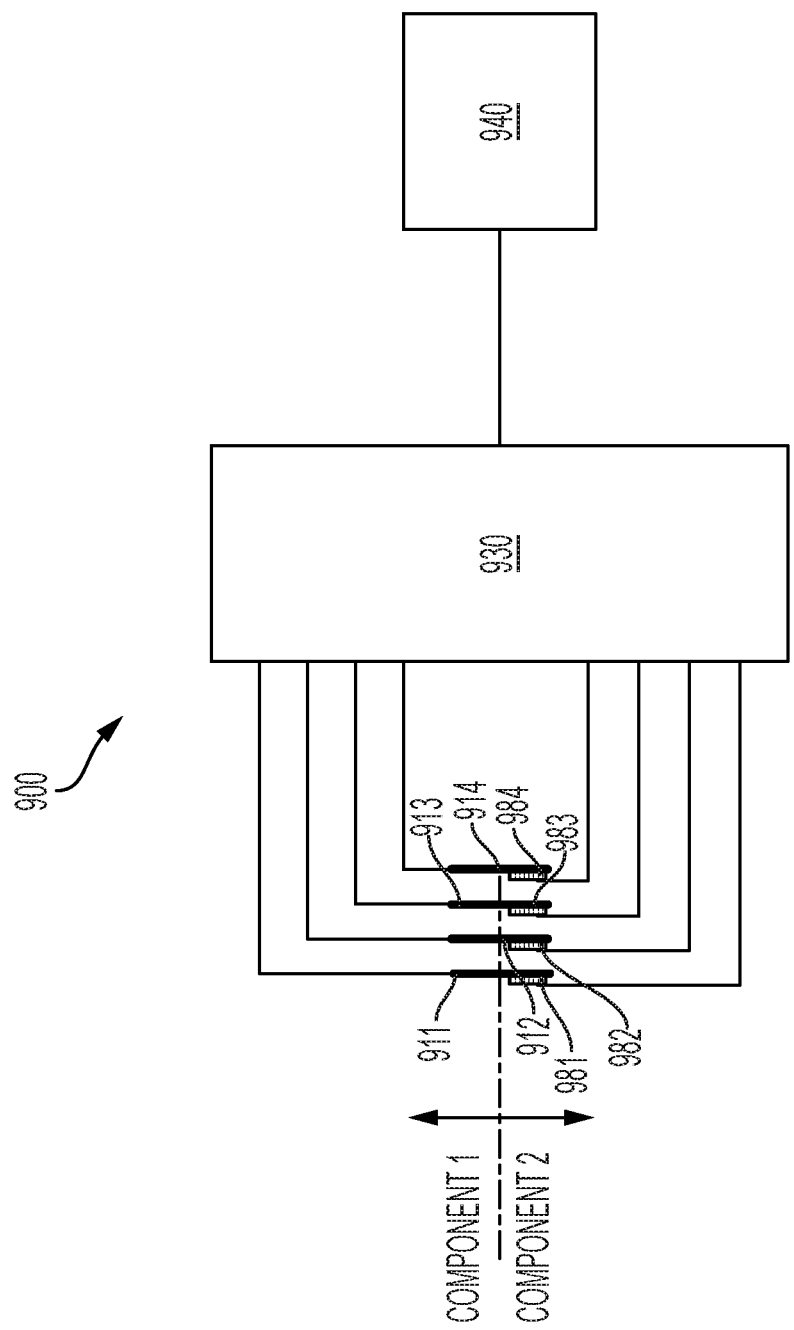
FIG. 9 illustrates a system comprising sensors that sense at least one parameter of each connection of multiple breakable remakeable connections between first and second components in accordance with some embodiments.

FIG. 9 illustrates a system 900 configured to sense at least one parameter of each connection of multiple breakable remakeable connections 911, 912, 913, 914 between first and second components. FIG. 9 shows four connections 911, 912, 913, 914, however, in a typical configuration the number of connections may be greater than four. System 900 includes sensors 981, 982, 983, 984 mechanically coupled to the connections 911, 912, 913, 914.

In this embodiment, the detector 930 is connected to the sensors 981, 982, 983, 984 and may also be connected to connections 911, 912, 913, 914. In this arrangement, the detector 930 receives sensor signals indicative of one or more parameters of the connections 911, 912, 913, 914. The detector 930 measures values of the parameters of the connections 911, 912, 913, 914 based on the sensor signals. The analyzer 940 uses the measured values of the sensor signals to assess whether the multiple connections 911, 912, 913, 914 have been broken and remade.

Figure 10:
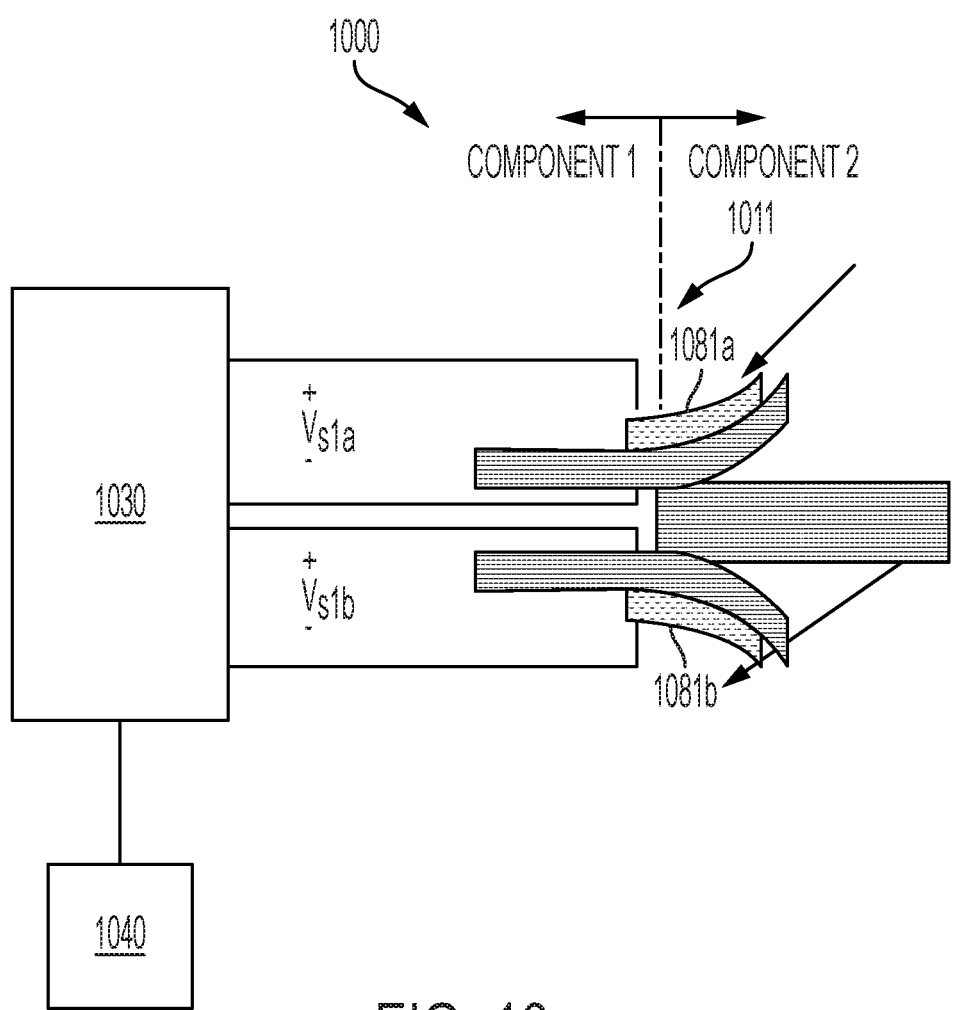
FIG. 10 is a block diagram of a system including piezoelectric sensors that sense a mechanical parameter of one or more breakable remakeable electrical connections in accordance with some embodiments.

FIG. 10 is a block diagram of a system 1000 that determines whether one or more breakable remakeable electrical connections 1011 that electrically couple a first component and a second component have been broken and remade. For example, the breakable remakeable electrical connection 1011 may comprise a circuit board edge connector inserted into spring loaded contacts. In a typical implementation, multiple breakable remakeable connections such as connection 1011 would electrically connect the first and second components.

Disturbance of the connection 1011 occurs when the optical connection 1011 is broken and remade, e.g., the circuit board edge connector is removed from the spring loaded contacts and the same circuit board or a different circuit board is reinserted. Breaking and remaking the optical connection 1011 can lead to physical changes of the connection 1011 that can be detected by sensing mechanical parameters of the connection 1011. For example, sensed values of stress or mechanical deformation of the connection 1011 may change when the connection 1011 is broken and remade.

Detector 1030 includes sensors 1081a, 1081b mechanically coupled to the connection 1011. In this particular example, sensors 1081a, 1081b comprise piezoelectric elements that exhibit a change in voltage based on mechanical deformation of the connection 1011. The detector 1030 is electrically coupled to measure voltages $V_{s1a}$, $V_{s1b}$ across the sensor elements 1081a, 1081b.

Analyzer 1040 is coupled to the detector 1030 and determines whether the multiple breakable remakeable connections 1011 between the first and second optical components have been broken and remade based on measured voltages $V_{s1a}$, $V_{s1b}$ across the piezoelectric elements 1081, 1082.

Figure 11:
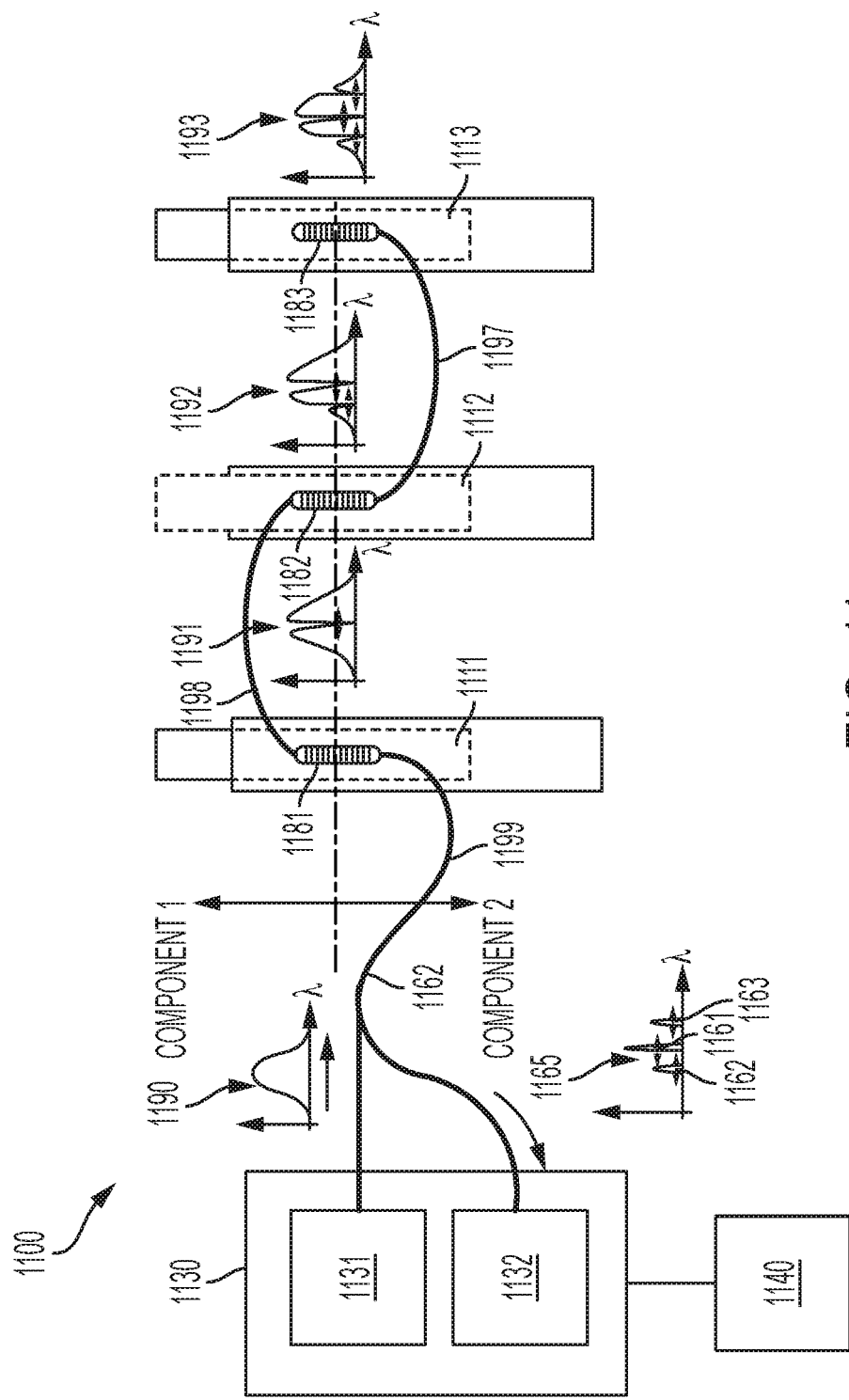
FIG. 11 is a block diagram of a system including optical sensors that sense a mechanical parameter of one or more breakable remakeable electrical connections in accordance with some embodiments.

FIG. 11 is a block diagram of a system 1100 configured to determine whether one or more breakable remakeable electrical connections 1111, 1112, 1113 that electrically couple a first component and a second component have been broken and remade. For example, the breakable remakeable electrical connections 1111, 1112, 1113 may comprise circuit board edge connectors inserted into spring loaded contacts.

Physical disturbance of the connections 1111, 1112, 1113 occurs when the electrical connections 1111, 1112, 1113 are broken and remade, e.g., the circuit board edge connector is removed from the spring loaded contacts and the same circuit board or a different circuit board reinserted. Breaking and remaking the connections 1111, 1112, 1113 can lead to physical changes of the connections 1111, 1112, 1113 that can be detected by sensing mechanical parameters of each connection 1111, 1112, 1113. For example, sensed values of stress or mechanical deformation of one or more of the connections 1111, 1112, 1113 may change when the connection 1111, 1112, 1113 is broken and remade.

Detector 1130 includes optical sensors 1181, 1182, 1183 mechanically coupled respectively to connections 1111, 1112, 1113. In this example, sensors 1181, 1182, 1183 comprise fiber Bragg grating (FBG) optical sensors that exhibit a change in their optical properties when mechanically deformed. The FBG sensors 1181, 1182, 1183 are optically connected to the detector, for example, the FBG sensors 1181, 1182, 1183 may be connected in series as shown.

Analyzer 1140 is coupled to the detector 1130 and determines whether the multiple breakable remakeable connections 1111, 1112, 1113 between the first and second optical components have been broken and remade based on optical signals from the FBG sensors 1181, 1182, 1183.

In this embodiment, the sensors 1181, 1182, 1183 are accessed by the detector 1130 using optical wavelength division modulation (WDM). As indicted in FIG. 11, broadband light is transmitted by the optical source 1131, which may comprise or be a light emitting diode (LED) or superluminescent laser diode (SLD), for example. The spectral characteristic (intensity vs. wavelength) of the broadband light is shown by inset graph 1190. The light is transmitted via a fiber optic cable 1199 to the first FBG sensor 1111. The first FBG sensor 1111 reflects a portion of the light in a first wavelength band having a central or peak wavelength, $\lambda 1$. Light having wavelengths other than the first wavelength band is transmitted through the first FBG sensor 1111 to the second FBG sensor 1112 through fiber optic cable 1198. The spectral characteristic of the light transmitted to the second FBG sensor 1112 is shown in inset graph 1191 and exhibits a notch at the first wavelength band centered at $\lambda 1$ indicating that light in this wavelength band is reflected by the first sensor 1111.

The second FBG sensor 1112 reflects a portion of the light in a second wavelength band having a central or peak wavelength, $\lambda 2$. Light that is not reflected by the second FBG sensor 1112 is transmitted through the second FBG sensor 1112 to the third FBG sensor 1113 through fiber optic cable 1197. The spectral characteristic of the light transmitted to the third FBG sensor 1113 is shown in inset graph 1192 and includes notches centered at $\lambda 1$ and $\lambda 2$.

The third FBG sensor 1113 reflects a portion of the light in a third wavelength band having a central or peak wavelength, $\lambda 3$. Light that is not reflected by the third FBG sensor 1113 is transmitted through the third FBG sensor 1113. The spectral characteristic of the light transmitted through the third FBG sensor 1113 is shown in inset graph 1193 and includes notches centered at $\lambda 1$, $\lambda 2$, and $\lambda 3$.

Light in wavelength bands 1161, 1162, 1163, having central wavelengths $\lambda 1$, $\lambda 2$ and $\lambda 3$ (illustrated in inset graph 1165) is reflected by the first, second, or third FBG sensors 1111, 1112, 1113, respectively, along the FO cables 1199, 1198, 1197 to the optical detector 1132. The optical detector 1132 may measure the central wavelength or wavelength band of the reflected signals from the FBG sensors 1181, 1182, 1183, for example. If the connections 1111, 1112, 1113 are broken and remade, the connections are mechanically deformed and the sensors 1181, 1182, 1183 are also mechanically deformed. Mechanical deformation of the sensors 1181, 1182, 1183 causes shifts in the central wavelengths and/or wavelength bands reflected by the sensors 1181, 1182, 1183.

Analyzer 1140 is coupled to the detector 1130 and determines whether the multiple breakable remakeable connections 1111, 1112, 1113 between the first and second optical components have been broken and remade based on measured parameter values of the reflected optical signals from the FBG sensors 1181, 1182, 1183. For example, the analyzer 1140 may compare the shifts in each the central wavelengths $\lambda 1$, $\lambda 2$ and $\lambda 3$, in the wavelength bands reflected by the sensors 1181, 1182, 1183, and/or mechanical parameter values, e.g., strain, derived from the shifts in the central wavelengths and/or wavelength bands to determine whether the optical connections 1111, 1112, 1113 have been broken and remade.

In some cases, instead of emitting broadband light, the light source 1131 may scan through a wavelength range, emitting light in narrow wavelength bands to which the various sensors 1181, 1182, 1183 are sensitive. The reflected light is sensed during a number of sensing periods that are timed relative to the emission of the narrowband light. For example, consider the scenario where sensors 1181, 1182, and 1183 are disposed on a FO cable. Sensor 1181 is sensitive to a first wavelength band WB1, sensor 1182 is sensitive to second wavelength band WB2, and sensor 1183 is sensitive to a third wavelength band WB3. The light source may be controlled to emit light having WB1 during time period 1 and sense reflected light during a time period 1a that overlaps time period 1. Following time period 1a, the light source may emit light having WB2 during time period 2 and sense reflected light during time period 2a that overlaps time period 2. Following time period 2a, the light source may emit light having WB3 during time period 3 and sense reflected light during time period 3a that overlaps time period 3. Using this version of optical time division multiplexing, each of the sensors 1181, 1182, 1183 may be interrogated during discrete time periods.

After the detector measures the parameter values, the analyzer process the measured parameter values to determine whether or not the connections have been broken and remade. For example, the analyzer may compare the measured parameter values to expected values to determine that a tampering event has occurred in which the connections are broken and remade.

In some embodiments, portions or all of the detector and/or the analyzer may be co-located, e.g., on the same circuit board, with the components whose connections are being monitored for tamper detection. In some embodiments portions or all of the detector and/or analyzer may be located on one or both of the components whose connections are being monitored for tamper detection. In some embodiments portions or all of the detector and/or analyzer may be remotely located from the components whose connections are being monitored for tamper detection. The detector and/or analyzer may be implemented in software, firmware, hardware or combinations thereof.

According to some implementations as discussed above, the analyzer may compare the measured parameter value for each connection to an expected value for that connection. In many implementations high bandwidth components require many connections between them. The larger the number of connections, the greater the likelihood that a tamper event in which the multiple connections are broken and remade can be detected. When multiple connections connect the components, values representative of the distribution of the measured parameter values of the multiple connections can be used to determine if connections have been broken and remade. For example, the analyzer may calculate statistical values for the distribution of measured parameter values and compare the calculated statistical values to expected statistical values to determine that a tampering event has occurred. For example, the analyzer may compare one or more of a calculated average, mean, median standard deviation, variance, etc. of the measured parameter distribution to an expected average, mean, median, standard deviation, variance, etc. In some embodiments, for K connections, the analyzer may calculate statistical values for the distribution of measured parameter values of subsets s1, s2, s3, s4, . . . of the K connections and compare the calculated statistical values of the subsets to expected statistical values of the subsets to determine that a tampering event has occurred.

Figure 12:
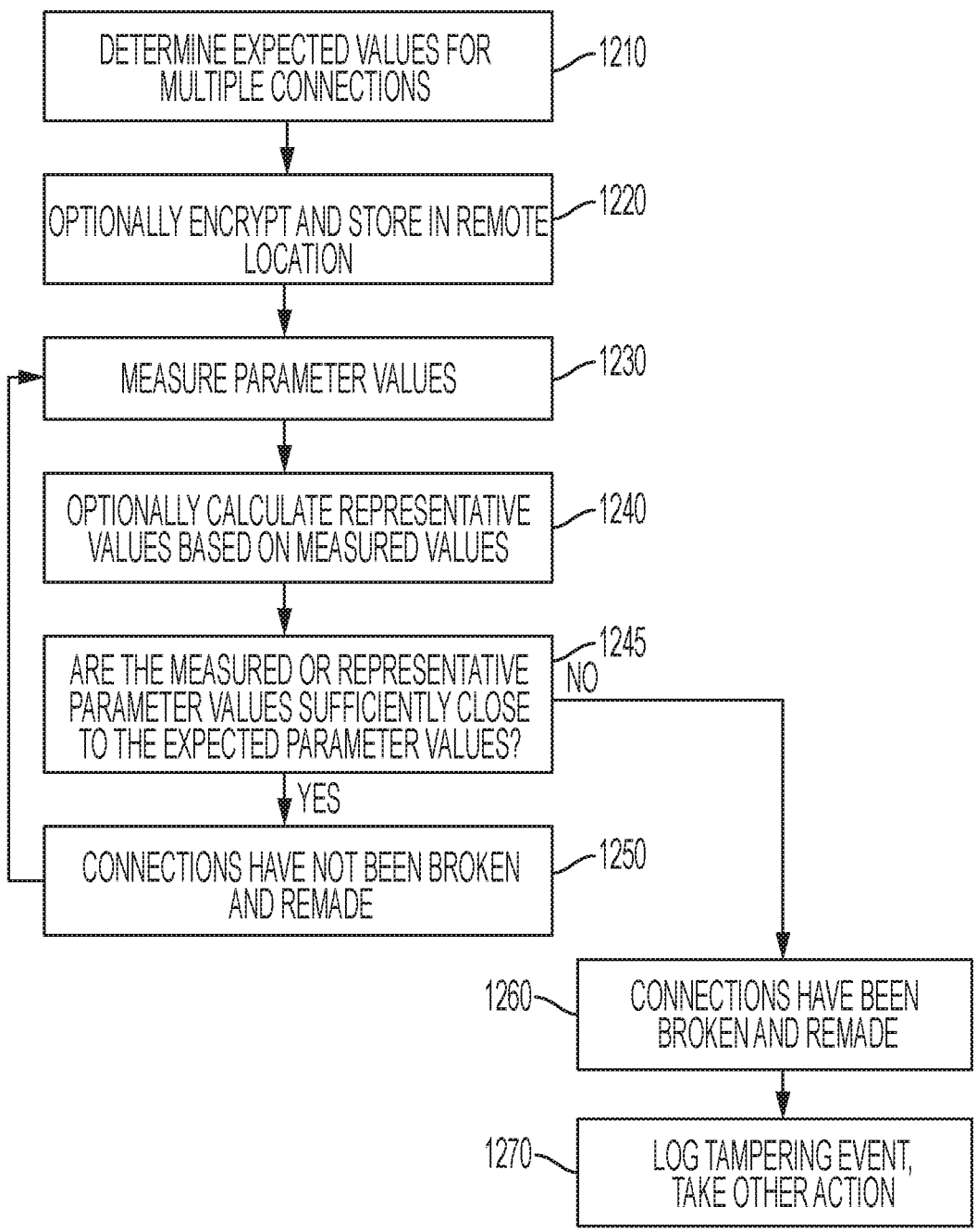
FIGS. 12 through 14 are flow diagrams that illustrate several example processes for determining that multiple connections between components have been broken and remade in accordance with some embodiments.
Figure 13:
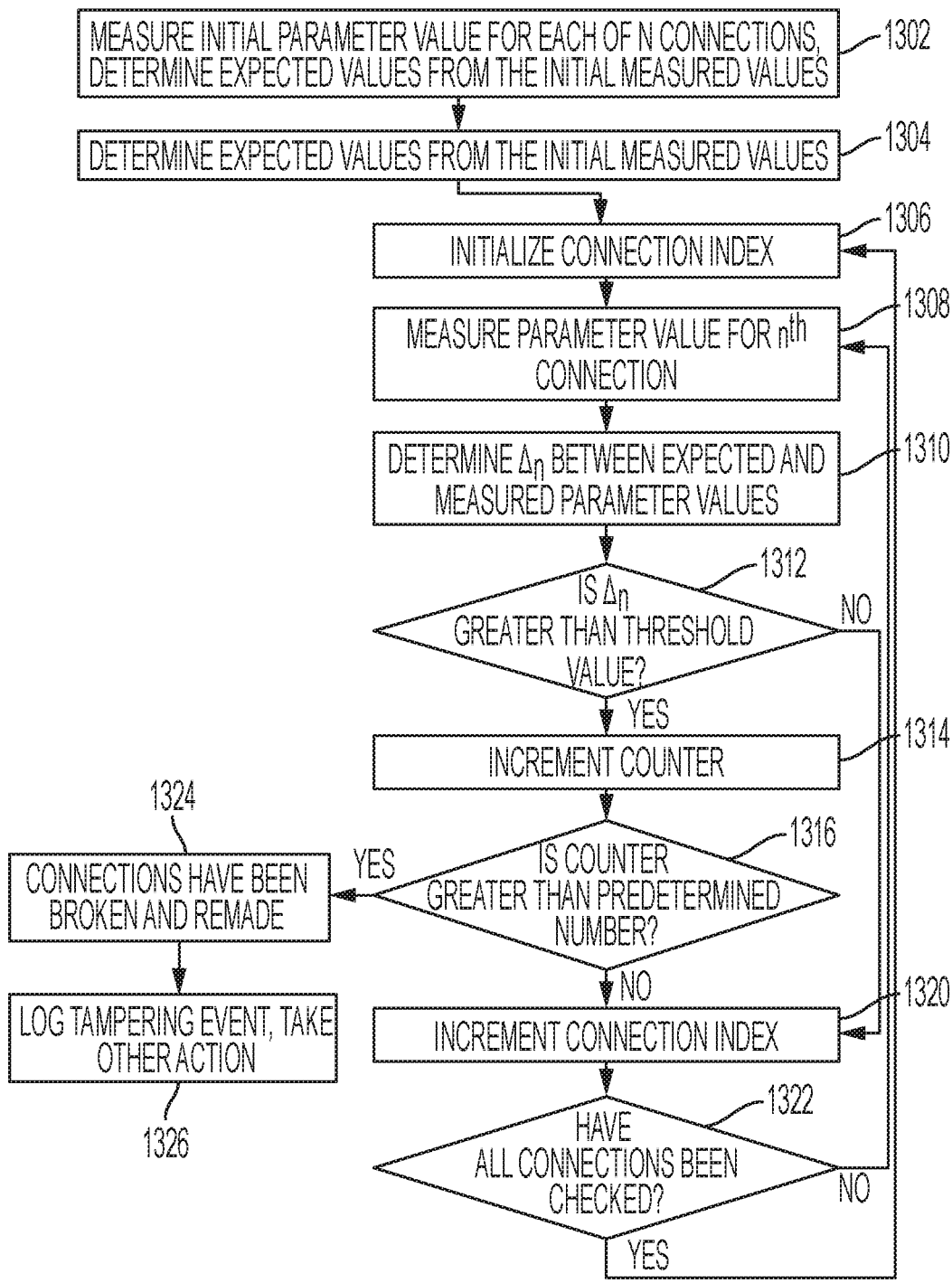
Figure 14:
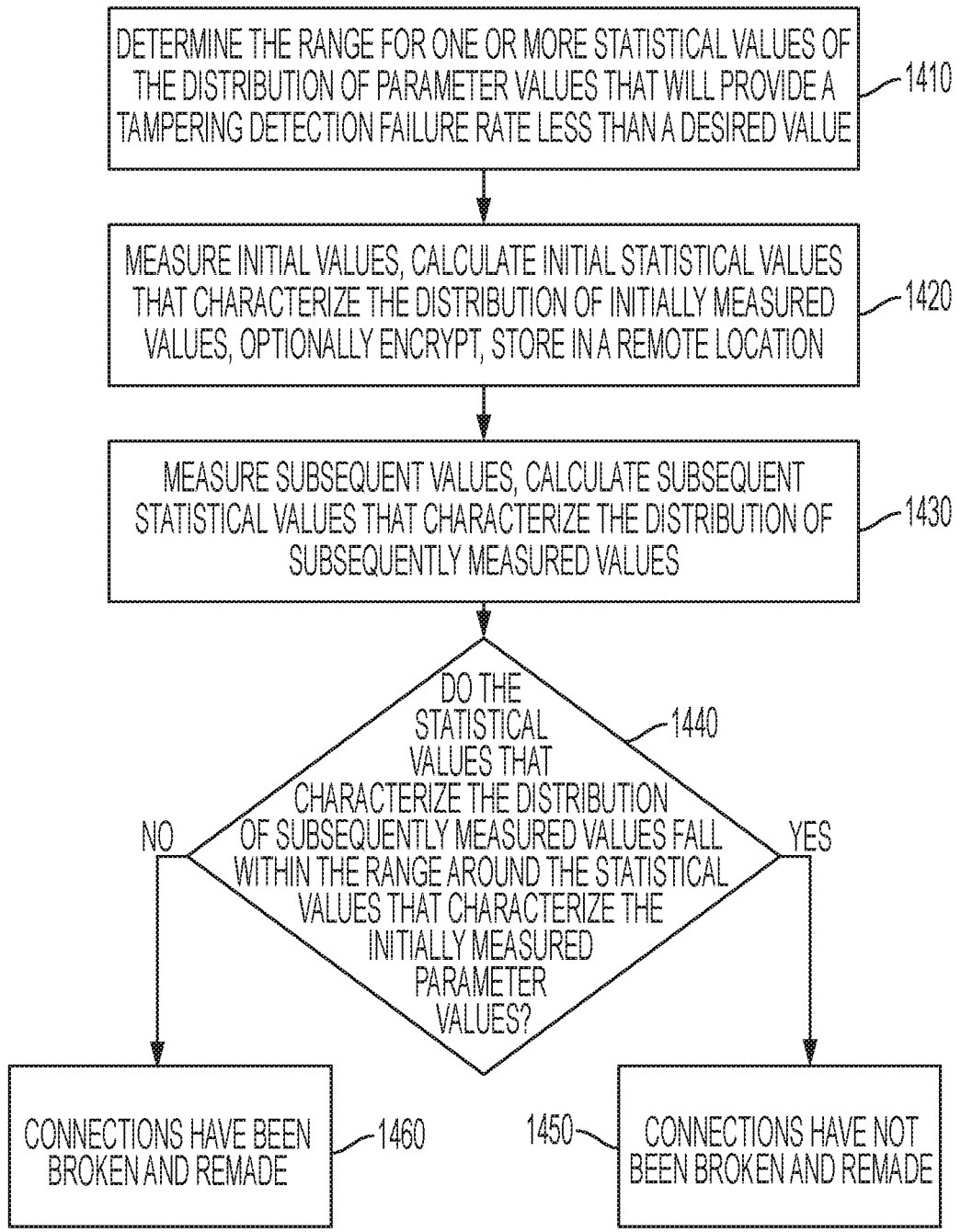

FIGS. 12 through 14 are flow diagrams that illustrate several example processes for determining that connections between components have been broken and remade. As illustrated in the flow diagram of FIG. 12, one or more expected values for the multiple connections are determined 1210. In some implementations, the expected values may be an expected parameter values for each individual connection. For example, in some embodiments, the expected values may be previously measured parameter values, e.g., parameter values measured by the detector soon after the first and second components were connected. In some embodiments, the expected values may be predicted values. The predicted expected values may take into account an expected or known drift of the measured parameter values. The predicted expected values may be based on a trend of measured parameter values in some embodiments. The trend may be calculated by the analyzer or elsewhere based on periodically measured parameter values. In some embodiments, the expected values may be statistical values for an expected distribution of parameter values, e.g., mean, average, standard deviation, variance, skewness of the expected distribution. In some embodiments, the expected values may be determined based on empirical data acquired from the connections being monitored or other connections similar to the monitored connections. In some embodiments, the expected values may be obtained through machine learning and/or other artificial intelligence techniques.

The expected values may be determined by the analyzer or may be determined elsewhere and input to the analyzer for comparison with measured values or representative values derived from the measured values. Optionally the expected values are encrypted and stored 1220 in a location remote from the connections that are being monitored for tamper detection. Remote storage of the expected values enhances the security of the temper detection.

The parameter values for the connections are measured 1230. Optionally, representative values are calculated 1240 from the measured parameter values. For example, the measured parameter values are used to calculate representative values that represent the distribution of the parameter values of the connections. Optionally, the values can be encrypted and/or stored in remote location In various implementations the calculated representative values can be one or more statistical values such as the mean, average, standard deviation, variance, skewness calculated from the distribution of measured parameter values.

The analyzer determines 1245 whether the measured or calculated representative values are sufficiently close to the expected values. If the measured or representative values are sufficiently close to the expected values, the analyzer determines 1250 that the connections have not been broken and remade. If the measured or calculated representative values are not sufficiently close to the expected values, the analyzer determines 1260 that the connections have been broken and remade. If the connections have been broken and remade, the analyzer may log the event 1270 and/or may take other action such as sending an alert signal, etc.

FIG. 13 is a flow diagram illustrating a process of determining that connections have been broken and remade in accordance with some embodiments. According to the illustrated process, the analyzer determines that the connections have been broken and remade if measured values of a predetermined number of connections are different from their expected values by more than a threshold difference.

The detector measures 1302 an initial parameter value for each connection and determines 1304 an expected value for each connection. For example, the expected value may be the initially measured value itself, or may be a value derived from the initially measured value. Optionally, the expected values are stored at a location remote from the connections being monitored for tamper detection. The connection index is initialized 1306 in preparation for comparing the measured value of each connection to its expected value.

The detector measures 1308 the value of the parameter of interest for the $n^{th}$ connection. The analyzer compares the measured value for the $n^{th}$ connection to the expected value for the $n^{th}$ connection by determining 1310 a difference, $\Delta_n$, between the measured value and the expected value. If the analyzer determines 1312 that the difference $\Delta_n$ is less than a threshold difference, the system continues 1320 to measure parameter values and to compare the measured parameter values to expected values until 1322 all N connections have been checked.

If the analyzer determines 1312 that difference $\Delta_n$ is greater than or equal to the threshold difference, the analyzer increments 1314 a counter that counts the number of connections for which the difference between the measured value and the expected value exceeds a threshold difference. If the counter value is 1316 less than or equal to a predetermined number, the system continues 1320 checking the connections until all N connections have been checked 1322.

If the counter value exceeds 1316 the predetermined number, the analyzer determines 1324 that the connections have been broken and remade. Connections that are broken and remade indicate a tampering event has occurred. The analyzer may log 1326 the tampering event or take other appropriate action.

In some embodiments the analyzer determines that multiple connections have been broken and remade if one or more statistical values, (e.g., mean, median, average, standard deviation, variance, skewness, etc.) of the distribution of measured values of the connections exceeds an acceptable range. As an example, the analyzer may determine that the multiple electrical connections have been broken and remade if the standard deviation of the distribution of resistance values of the multiple connections changes by more than 10% from the initial standard deviation and/or the average of the distribution of resistance values of the multiple connections changes by more than 20% from the initial average.

FIG. 14 illustrates a process for detecting that connections have been broken and remade in accordance with some embodiments. An acceptable range of values for a set of one or more statistical parameters that characterize the distribution of measured values is determined 1410. The acceptable range (or ranges) for the statistical parameter (or parameters) provides a tampering detection failure rate less than a desired value. The acceptable range (or ranges) for the statistical values may be determined by any suitable process, such as by machine learning in which a processor learns which statistical parameters and/or the ranges of for statistical parameters that result in a tampering detection failure rate less than a desired failure rate. The tampering detection failure rate may include false positives and/or undetected tampering events, for example.

The initial values are measured 1420 and statistical values that characterize the distribution of initially measured values are calculated. To enhance cybersecurity, the initial values, calculated statistical values, and/or acceptable ranges may optionally be encrypted and stored in a location remote from the connections being monitored.

Parameter values of the connections are subsequently measured 1430 and statistical values that characterize the distribution of subsequently measured parameter values are calculated. The analyzer determines 1440 whether the statistical values that characterize the distribution of subsequently measured parameter values fall within the acceptable ranges around the statistical values that characterize the initially measured parameter values. If the statistical values of the distribution of the subsequently measured parameter values fall within the acceptable range, then the analyzer determines 1450 that the connections have not been broken and remade. If the statistical values of the distribution of the subsequently measured parameter values fall outside the acceptable range, then the analyzer determines 1460 that the connections have been broken and remade and detects a tampering event.

The embodiments described herein provide a new layer of security by enabling detection of broken and remade connections such as connections on circuit boards, internet connections, chips in sockets, and any other reworkable connections in electronic and/or optical systems. The disclosed approaches are inexpensive and can provide high information density bandwidth field reworkable connections which are unclonable and tamper evident. The disclosed approaches provide an unclonable connection which can be used instead of or in addition to an unclonable device, thus providing a complementary security function that enhances the flexibility/security tradeoff of systems overall. The embodiments described herein enable modular hardware with security assurances along with decreased design costs and simplified system design. In particular the use of the disclosed tamper detection approaches can reduce the likelihood of a "man in the middle" attack in which a component is inserted in the connection path between the first and second components.

Various modifications and alterations of the embodiments discussed above will be apparent to those skilled in the art, and it should be understood that this disclosure is not limited to the illustrative embodiments set forth herein. The reader should assume that features of one disclosed embodiment can also be applied to all other disclosed embodiments unless otherwise indicated. It should also be understood that all U.S. patents, patent applications, patent application publications, and other patent and non-patent documents referred to herein are incorporated by reference, to the extent they do not contradict the foregoing disclosure.

The invention claimed is:
1. A system, comprising:
   a detector configured to measure a value of a parameter for each connection of multiple breakable remakeable connections between a first component and a second component; and
   an analyzer configured to:
      compare the measured parameter value for each connection or a representative value derived from measured parameter values to an expected value; and determine whether the multiple breakable remakeable connections between the first and second components have been broken and remade based on the comparisons.

2. The system of claim 1, wherein:
each of the multiple connections is an electrical connection and the parameter is an electrical parameter; or
each of the multiple connections is an optical connection and the parameter is an optical parameter.

3. The device of claim 1, wherein:
each of the multiple connections is an electrical connection; and
the parameter is a mechanical parameter.

4. The device of claim 1 wherein the detector comprises a sensor configured to sense the parameter.

5. The system of claim 1, wherein:
each connection has a first side proximate the first component and a second side proximate the second component; and
the detector is configured to measure the value of the parameter for each connection of the multiple breakable remakeable connections by applying a signal at the first side of the connection and sensing a signal at the second side of the connection.

6. The system of claim 1, wherein:
each connection has a first side proximate the first component and a second side proximate the second component; and
the detector is configured to measure the value of the parameter for each connection of the multiple breakable remakeable connections by applying a signal at the first side of the connection and sensing a reflected signal the first side of the connection.

7. The system of claim 1, wherein:
the detector comprises piezoelectric elements mechanically coupled to each connection of the multiple breakable remakeable connections; and
the detector is configured to measure a voltage across each of the piezoelectric elements, wherein the voltage across each piezoelectric element indicates a bending force of the connection.

8. The system of claim 1, wherein the analyzer is configured to:
determine a number of connections having a difference between the measured parameter value or the representative parameter value and the expected parameter value that is greater than a threshold value; and
determine that the multiple breakable remakeable connections have been broken and remade based on the number.

9. The system of claim 1, wherein:
the detector is configured to measure a value of multiple parameters for each connection of multiple breakable remakeable connections; and
for each connection the analyzer is configured to compare the measured value of each of the multiple parameters to expected values for each of the multiple parameters.

10. A system, comprising:
a detector configured to measure a value of a parameter for each connection of multiple breakable remakeable connections between a first component and a second component; and
an analyzer configured to:
calculate one or more representative values that characterize the measured parameter values;
compare the one or more representative values that characterize measured parameter values respectively to one or more expected values; and
determine whether the multiple breakable remakeable connections between the first and second components have been broken and remade based on the comparisons.

11. The system of claim 10, wherein:
the representative values are statistical values that characterize a distribution of the measured parameter values; and
the expected values are expected statistical values.

12. The system of claim 10, wherein the one or more expected statistical values provide a tamper detection failure rate that is less than or equal to an acceptable tamper detection failure rate.

13. A method, comprising:
measuring a value of at least one parameter for each connection of multiple breakable remakeable connections between a first component and a second component;
comparing the measured values of the multiple breakable remakeable connections or comparing one or more representative values that characterize the measured values to at least one expected value; and
determining whether the multiple breakable remakeable connections between the first and second components have been broken and remade based on the comparison.

14. The method of claim 13, wherein the representative value is a statistical value that characterizes the distribution of the measured values of the multiple breakable remakeable connections.

15. The method of claim 13, wherein the expected value is a previously measured value.

16. The method of claim 13, wherein the expected value is a predicted value.

17. The method of claim 13, wherein the expected value is an expected range of values.

18. The method of claim 17, wherein comparing the measured values or comparing the representative values to the at least one expected value comprises determining if the measured values or the representative values fall within the expected range.

19. The method of claim 13, further comprising determining the expected value such that the expected values provides a tamper detection failure rate less than or equal to an acceptable tamper detection failure rate.

20. The method of claim 13, wherein:
the at least one parameter is a mechanical parameter; and
measuring the value of the mechanical parameter comprises optically or piezoelectrically measuring the mechanical value.

* * * * *